(12) United States Patent
Funahashi et al.

(10) Patent No.: US 9,287,296 B2
(45) Date of Patent: Mar. 15, 2016

(54) DISPLAY DEVICE

(71) Applicant: Panasonic Liquid Crystal Display Co., Ltd., Himeji-shi, Hyogo (JP)

(72) Inventors: Yuuta Funahashi, Hyogo (JP); Masafumi Hirata, Osaka (JP); Yugo Takeda, Osaka (JP)

(73) Assignee: Panasonic Liquid Crystal Display Co., Ltd., Hyogo (JP)

(*) Notice: Subject to any disclaimer, the term of this patent is extended or adjusted under 35 U.S.C. 154(b) by 36 days.

(21) Appl. No.: 14/199,529

(22) Filed: Mar. 6, 2014

(65) Prior Publication Data

US 2015/0060858 A1 Mar. 5, 2015

(30) Foreign Application Priority Data

Aug. 29, 2013 (JP) .................. 2013-177612

(51) Int. Cl.
*G02F 1/1339* (2006.01)
*G02F 1/1362* (2006.01)
*H01L 27/12* (2006.01)

(52) U.S. Cl.
CPC .......... *H01L 27/124* (2013.01); *G02F 1/13394* (2013.01); *G02F 1/136286* (2013.01)

(58) Field of Classification Search
CPC ............... G02F 1/13394; G02F 2001/13396; G02F 1/136286; H01L 27/124
See application file for complete search history.

(56) References Cited

U.S. PATENT DOCUMENTS

| | | | |
|---|---|---|---|
| 9,134,566 B2* | 9/2015 | Cho | G02F 1/133514 |
| 2003/0025864 A1* | 2/2003 | Chida et al. | 349/124 |
| 2007/0216847 A1* | 9/2007 | Chang et al. | 349/155 |
| 2009/0185094 A1* | 7/2009 | Lee | G02F 1/13394 349/46 |
| 2009/0303423 A1* | 12/2009 | Kim | G02F 1/13394 349/110 |
| 2009/0310050 A1* | 12/2009 | Shin | G02F 1/136213 349/39 |
| 2010/0110022 A1* | 5/2010 | Chen | G06F 3/0414 345/173 |
| 2010/0118254 A1* | 5/2010 | Hashimoto | 349/155 |
| 2011/0069258 A1* | 3/2011 | Joo | G02B 5/201 349/106 |
| 2012/0081641 A1* | 4/2012 | Noh et al. | 349/106 |
| 2012/0113347 A1* | 5/2012 | Shim | G02F 1/13394 349/43 |
| 2013/0021552 A1* | 1/2013 | Tomioka et al. | 349/43 |

FOREIGN PATENT DOCUMENTS

| | | |
|---|---|---|
| JP | 2002-196338 | 7/2002 |
| JP | 2002-214621 | 7/2002 |
| JP | 2004-341215 | 12/2004 |

* cited by examiner

*Primary Examiner* — Dennis Y Kim
(74) *Attorney, Agent, or Firm* — Hamre, Schumann, Mueller & Larson, P.C.

(57) ABSTRACT

Provided is a display device, in which: a plurality of spacers placed between a first substrate and a second substrate include a first spacer placed between a first thin film transistor and a second thin film transistor and a second spacer placed between the first thin film transistor and a third thin film transistor; and a distance between a center of the first spacer and a center of a line width of a first data line is smaller than a distance between a center of the second spacer and a center of a line width of a second data line.

8 Claims, 7 Drawing Sheets

DISPLAY DEVICE

CROSS-REFERENCE TO RELATED APPLICATION

The present application claims priority from Japanese application JP2013-177612 filed on Aug. 29, 2013, the content of which is hereby incorporated by reference into this application.

TECHNICAL FIELD

The present application relates to a display device, in particular, placement of spacers formed between a first substrate and a second substrate.

BACKGROUND

In a display device, the spacer is placed in order to maintain a distance (gap) between a first substrate and a second substrate. The spacer needs to be placed in a position that does not decrease an aperture ratio of a pixel. For example, Japanese Patent Application Laid-open No. 2002-196338 discloses a technology relating to placement of spacers for suppressing the decrease in the aperture ratio of the pixel.

Specifically, in a liquid crystal display element disclosed in Japanese Patent Application Laid-open No. 2002-196338, spacers are placed at the rate of one spacer for at least two pixel electrodes, and a notch for placing the spacer is formed in the pixel electrode in a part in which the spacer is placed.

SUMMARY

However, in recent years, display devices have smaller areas for placing spacers therein as resolution thereof is becoming higher, and have a problem of an influence of a leak of light through a flaw in a light transmitting area thereof caused by the spacer due to deviation caused when two substrates are bonded together or warping of the substrates.

The present invention has been made in view of the above-mentioned problem, and an object thereof is to provide a display device capable of suppressing an influence of a leak of light ascribable to deviation caused when two substrates are bonded together or warping of the substrates.

In one general aspect, the instant application describes a display device that a first substrate; a second substrate opposed to the first substrate; a plurality of spacers placed between the first substrate and the second substrate; a plurality of data lines extending in a column direction, which are formed on the first substrate; a plurality of gate lines extending in a row direction, which are formed on the first substrate; a plurality of thin film transistors each formed on the first substrate near an intersection of each of the plurality of data lines and each of the plurality of gate lines; a plurality of pixels formed on the first substrate and arranged in a matrix shape, the plurality of pixels each being defined by adjacent two of the plurality of data lines and adjacent two of the plurality of gate lines; and a plurality of light transmission portions formed on the second substrate, so as to be opposed to the plurality of pixels on a one-to-one basis. The plurality of pixels may include a first pixel opposed to a first light transmission portion for transmitting light in a first color; a second pixel opposed to a second light transmission portion for transmitting light in a second color that is higher in visibility than the light in the first color; and a third pixel opposed to a third light transmission portion for transmitting light in a third color that is higher in visibility than the light in the first color. The plurality of data lines may include a first data line placed between the first pixel and the second pixel that are adjacent to each other; and a second data line placed between the first pixel and the third pixel that are adjacent to each other. The plurality of thin film transistors may include a first thin film transistor formed within an area of the first pixel; a second thin film transistor formed within an area of the second pixel; and a third thin film transistor formed within an area of the third pixel. The plurality of spacers may include a first spacer placed between the first thin film transistor and the second thin film transistor that are adjacent to each other in the row direction; and a second spacer placed between the first thin film transistor and the third thin film transistor that are adjacent to each other in the row direction. A distance between a center of the first spacer and a center of a line width of the first data line is smaller than a distance between a center of the second spacer and a center of a line width of the second data line.

The display device may further include a liquid crystal layer between the first substrate and the second substrate. The first substrate may further include an alignment layer; and the alignment layer is subjected to a light alignment process.

In another general aspect, the instant application of a display device that includes a first substrate; a second substrate opposed to the first substrate; a plurality of spacers placed between the first substrate and the second substrate; a plurality of seatings for supporting the plurality of spacers, which are formed on the first substrate; a plurality of data lines extending in a column direction, which are formed on the first substrate; a plurality of gate lines extending in a row direction, which are formed on the first substrate; a plurality of thin film transistors each formed on the first substrate near an intersection of each of the plurality of data lines and each of the plurality of gate lines; a plurality of pixels formed on the first substrate and arranged in a matrix shape, the plurality of pixels each being defined by adjacent two of the plurality of data lines and adjacent two of the plurality of gate lines; and a plurality of light transmission portions formed on the second substrate, so as to be opposed to the plurality of pixels on a one-to-one basis. The plurality of pixels include a first pixel opposed to a first light transmission portion for transmitting light in a first color; a second pixel opposed to a second light transmission portion for transmitting light in a second color that is higher in visibility than the light in the first color; and a third pixel opposed to a third light transmission portion for transmitting light in a third color that is higher in visibility than the light in the first color. The plurality of data lines include a first data line placed between the first pixel and the second pixel that are adjacent to each other; and a second data line placed between the first pixel and the third pixel that are adjacent to each other. The plurality of thin film transistors include a first thin film transistor formed within an area of the first pixel; a second thin film transistor formed within an area of the second pixel; and a third thin film transistor formed within an area of the third pixel. The plurality of seatings include a first seating placed between the first thin film transistor and the second thin film transistor that are adjacent to each other in the row direction; and a second seating placed between the first thin film transistor and the third thin film transistor that are adjacent to each other in the row direction. The plurality of spacers include a first spacer placed on the first seating; and a second spacer placed on the second seating. A center of the first spacer is shifted toward the first thin film transistor side from a center of the first seating, and a center of the second spacer is shifted toward the first thin film transistor side from a center of the second seating.

A distance between the center of the first spacer and the center of the first seating may be substantially the same as a distance between the center of the second spacer and the center of the second seating.

In an another general aspect, a display device of this application include a first substrate; a second substrate opposed to the first substrate; a plurality of spacers placed between the first substrate and the second substrate; a plurality of data lines extending in a column direction, which are formed on the first substrate; a plurality of gate lines extending in a row direction, which are formed on the first substrate; a plurality of thin film transistors each formed on the first substrate near an intersection of each of the plurality of data lines and each of the plurality of gate lines; a plurality of pixels formed on the first substrate and arranged in a matrix shape, the plurality of pixels each being defined by adjacent two of the plurality of data lines and adjacent two of the plurality of gate lines; and a plurality of light transmission portions formed on the second substrate, so as to be opposed to the plurality of pixels on a one-to-one basis. The plurality of pixels includes a blue pixel opposed to a light transmission portion for transmitting blue light; a green pixel opposed to a light transmission portion for transmitting green light; and a red pixel opposed to a light transmission portion for transmitting red light. The plurality of thin film transistors include a first thin film transistor formed within an area of the blue pixel; a second thin film transistor formed within an area of the green pixel; and a third thin film transistor formed within an area of the red pixel. The plurality of spacers are placed between the first thin film transistor and the second thin film transistor that are adjacent to each other in the row direction and between the first thin film transistor and the third thin film transistor that are adjacent to each other in the row direction, and no spacer is placed between the second thin film transistor and the third thin film transistor that are adjacent to each other in the row direction.

In another general aspect, a display device of this application includes a first substrate; a second substrate opposed to the first substrate; and a plurality of spacers placed between the first substrate and the second substrate. The second substrate includes a blue light transmission portion formed thereon, for transmitting blue light; a green light transmission portion formed thereon, for transmitting green light; and a red light transmission portion formed thereon, for transmitting red light, which are placed in a matrix shape and each of which is surrounded by a light shielding layer and has an area for transmitting light, the area having substantially a rectangle shape formed of short sides and long sides. The plurality of spacers include a first spacer placed near a boundary between the blue light transmission portion and the green light transmission portion and near a short side of the light transmission portion; and a second spacer placed near a boundary between the blue light transmission portion and the red light transmission portion and near the short side of the light transmission portion. A distance between a center of a short side of the blue light transmission portion and a center of the first spacer is smaller than a distance between a center of a short side of the green light transmission portion and a center of the first spacer.

In another general aspect, a display device of this application include a first substrate; a second substrate opposed to the first substrate; and a plurality of spacers placed between the first substrate and the second substrate. The second substrate includes a blue light transmission portion formed thereon, for transmitting blue light; a green light transmission portion formed thereon, for transmitting green light; and a red light transmission portion formed thereon, for transmitting red light, which are placed in a matrix shape and each of which is surrounded by a light shielding layer and has an area for transmitting light, the area having substantially a rectangle shape formed of short sides and long sides. The plurality of spacers include a first spacer placed near a boundary between the blue light transmission portion and the green light transmission portion and near a short side of the light transmission portion; and a second spacer placed near a boundary between the blue light transmission portion and the red light transmission portion and near the short side of the light transmission portion. A distance between a center of a short side of the blue light transmission portion and a center of the first spacer is smaller than a distance between a center of a short side of the red light transmission portion and a center of the second spacer.

DETAILED DESCRIPTION

An embodiment of the present application is described below with reference to the accompanying drawings. In this embodiment, a liquid crystal display device is taken as an example, but a display device according to the present application is not limited to the liquid crystal display device, and may be, for example, an organic EL display device.

Figure 1:
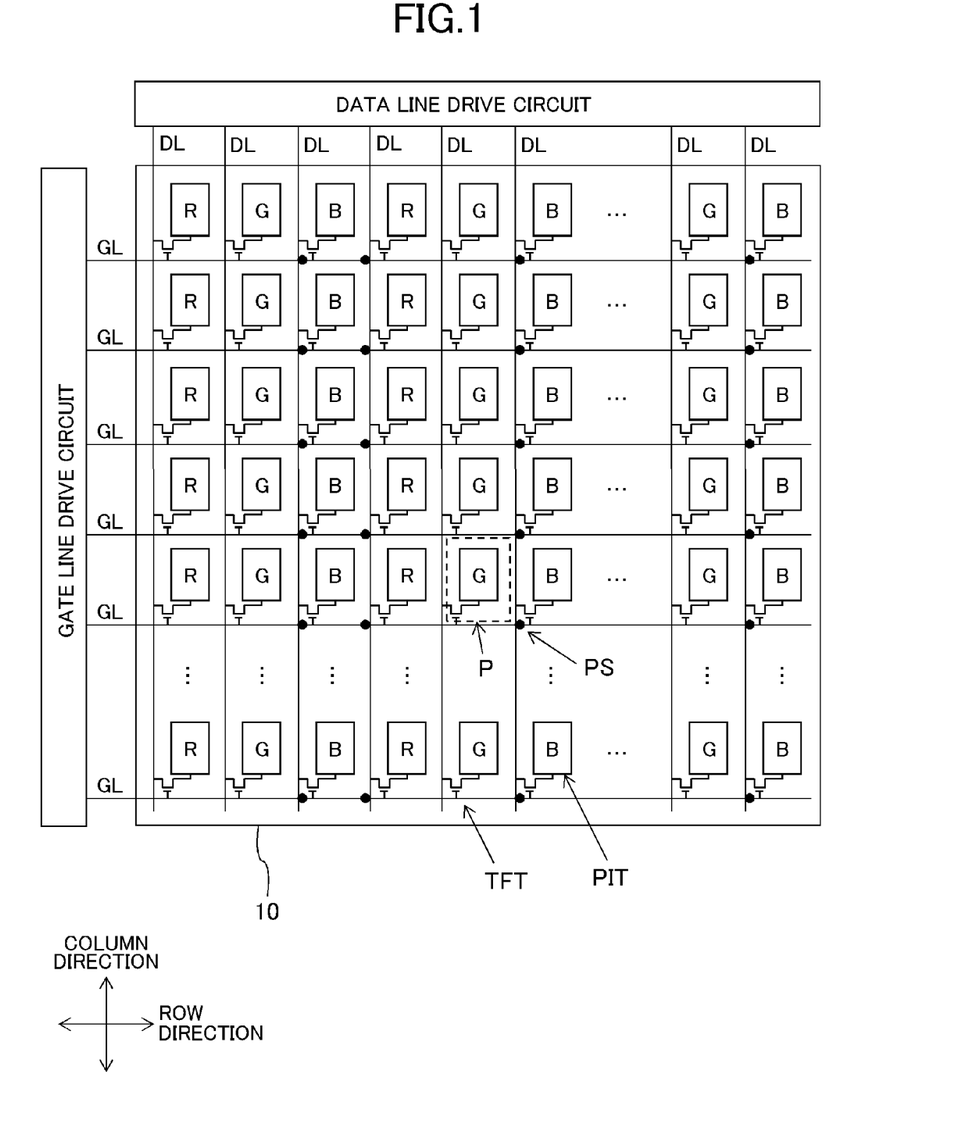
FIG. 1 is a plan view illustrating a configuration of a liquid crystal display device according to an embodiment of the present implementation.

FIG. 1 is a plan view illustrating an overall configuration of a liquid crystal display device according to this embodiment. The liquid crystal display device includes a display panel 10 for displaying an image, drive circuits (data line drive circuit and gate line drive circuit) for driving the display panel 10, a control circuit (not shown) for controlling the drive circuits, and a backlight unit (not shown) for illuminating the display panel 10 with light from a back surface side. FIG. 1 also illustrates spacers PS to be described later.

Figure 2:
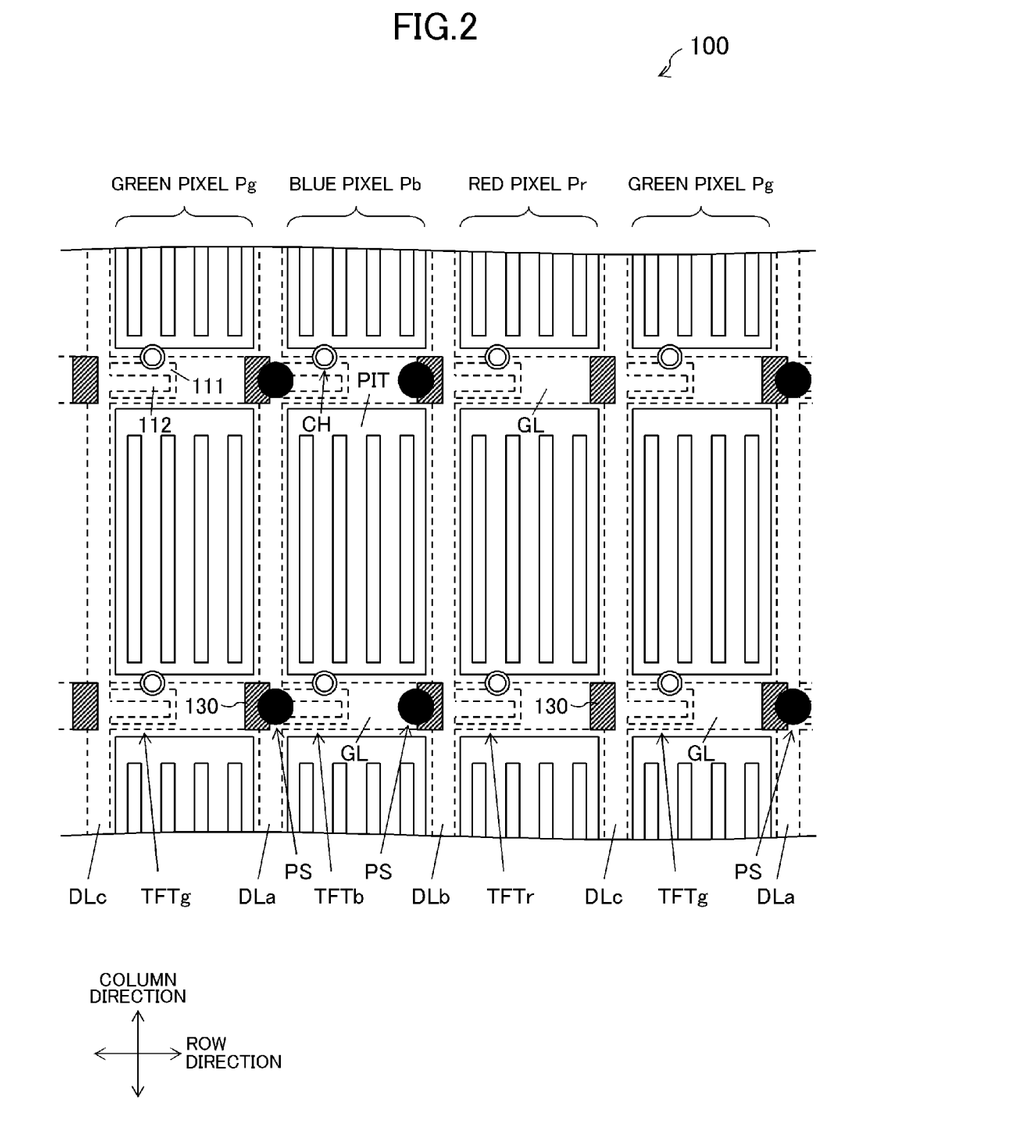
FIG. 2 is a plan view illustrating a configuration of a TFT substrate.
Figure 3:
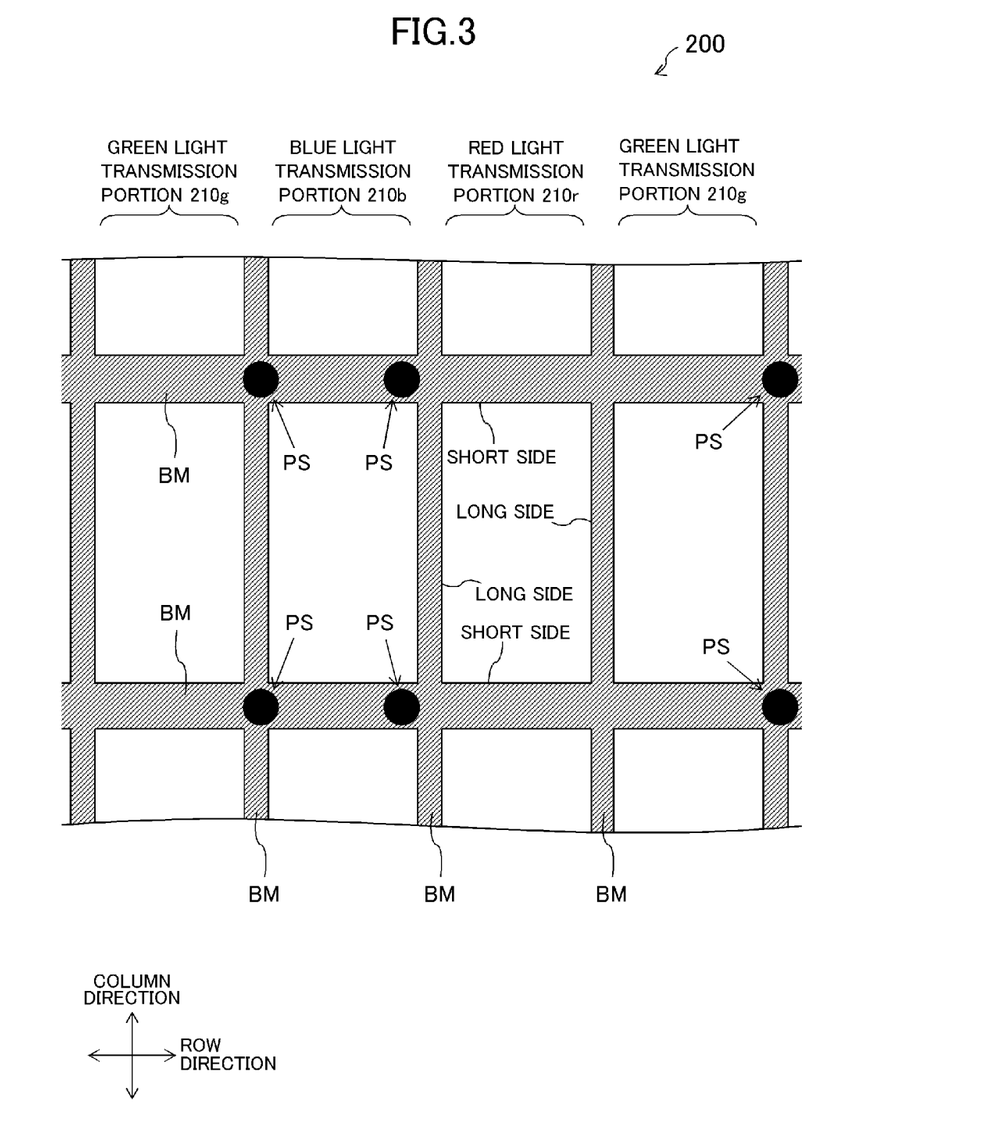
FIG. 3 is a plan view illustrating a configuration of a CF substrate.
Figure 4:
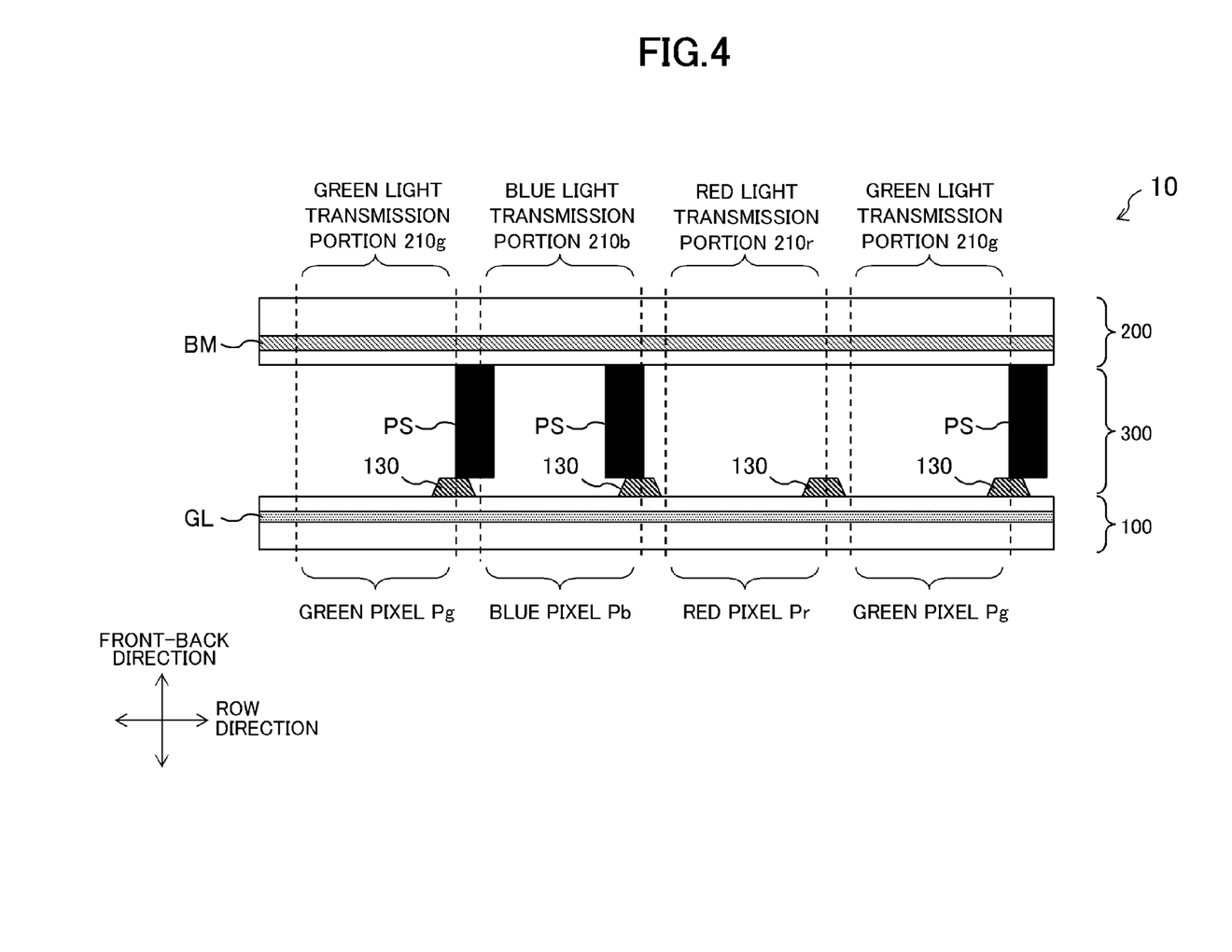
FIG. 4 is a sectional view illustrating a configuration of a display panel.

A liquid crystal display device 10 includes: a thin film transistor substrate 100 (hereinafter referred to as "TFT substrate") (first substrate) located on a back surface side; a color filter substrate 200 (hereinafter referred to as "CF substrate") (second substrate) located on a front surface side and opposed to the TFT substrate 100; and a liquid crystal layer 300 sandwiched between the TFT substrate 100 and the CF substrate 200. FIG. 2 is a plan view illustrating a configuration of a part of the TFT substrate 100, and FIG. 3 is a plan view illustrating a configuration of a part of the CF substrate 200. FIG. 2 and FIG. 3 each illustrate a state in which the display panel 10 is viewed in a viewing direction. Further, the overall configurations of the TFT substrate 100 and the CF substrate 200 illustrated in FIG. 1 are formed of a series of the configurations illustrated in FIG. 2 and FIG. 3. FIG. 4 is a sectional view illustrating a configuration of the display panel 10.

As illustrated in FIG. 2, a plurality of data lines DL (DLa, DLb, and DLc) and a plurality of gate lines GL are formed on the TFT substrate 100 so as to extend in the column direction and in the row direction, respectively. A thin film transistor (hereinafter referred to as "TFT") (TFTr, TFTg, and TFTb) is formed in the vicinity of each of intersections between the plurality of data lines DL and the plurality of gate lines GL. A rectangular area surrounded by two adjacent data lines DL and two adjacent gate lines GL is defined as one pixel P (Pr, Pg, or Pb), and a plurality of the pixels P are arranged in a matrix shape. A pixel electrode PIT, which is formed of a transparent conductive film of indium tin oxide (ITO) or the like and includes aperture portions, is provided to each of the pixels P. In the TFT, a semiconductor layer 111 formed of amorphous silicon (aSi) is formed on a gate insulating film (not shown), and a drain electrode 112 and a source electrode (not shown) are formed on the semiconductor layer 111. The drain electrode 112 is electrically connected to the data line DL, and the source electrode is electrically connected to the pixel electrode PIT via a contact hole CH.

As illustrated in FIG. 3 and FIG. 4, a plurality of light transmission portions 210 (210r, 210g, and 210b), which are respectively opposed to a plurality of pixels P, and a plurality of spacers PS, which are placed between the TFT substrate 100 and the CF substrate 200, for maintaining a distance (gap) between two substrates, are formed on the CF substrate 200. Note that, FIG. 4 illustrates a section of the display panel 10 of FIG. 2 and FIG. 3 cut along the gate line GL, and a known configuration of the TFT or the like is omitted.

As illustrated in FIG. 3, the light transmission portion 210 is surrounded by a light shielding layer (black matrix) BM for blocking light from transmitting therethrough and is formed to have a rectangular shape formed of two opposed short sides and two opposed long sides. Further, a plurality of light transmission portions 210 include: a red light transmission portion 210r in which a colored layer for the red color (red color layer) is formed to transmit red (R-color) light; a green light transmission portion 210g in which a colored layer for the green color (green color layer) is formed to transmit green (G-color) light; and a blue light transmission portion 210b in which a colored layer for the blue color (blue color layer) is formed to transmit blue (B-color) light. The red light transmission portion 210r, the green light transmission portion 210g, and the blue light transmission portion 210b are arrayed in the row direction in the stated order. The light transmission portions 210 for the same color are arrayed in the column direction. The light shielding layer BM is formed in the area between the light transmission portions 210 that are adjacent to each other in the row direction and the column direction.

As illustrated in FIG. 2, a plurality of pixels P include a red pixel Pr (third pixel) opposed to the red light transmission portion 210r, a green pixel Pg (second pixel) opposed to the green light transmission portion 210g, and a blue pixel Pb (first pixel) opposed to the blue light transmission portion 210b. Further, the plurality of pixels P are arrayed so as to correspond to the arrangement of the light transmission portions 210, and the red pixel Pr, the green pixel Pg, and the blue pixel Pb are arrayed in the row direction in the stated order, while the pixels P of the same color are arrayed in the column direction.

A plurality of TFTs include a third TFT TFTr formed within the area of the red pixel Pr, a second TFT TFTg formed within the area of the green pixel Pg, and a first TFT TFTb formed within the area of the blue pixel Pb.

A plurality of data lines DL include a first data line DLa placed between the blue pixel Pb and the green pixel Pg that are adjacent to each other, a second data line DLb placed between the blue pixel Pb and the red pixel Pr that are adjacent to each other, and a third data line DLc placed between the red pixel Pr and the green pixel Pg that are adjacent to each other. The first data line DLa, the second data line DLb, and the third data line DLc are arrayed in the row direction in the stated order.

As illustrated in FIG. 3, the spacer PS is formed on the CF substrate 200 so as to overlap with the light shielding layer BM and the gate line GL in the plan view. Further, areas for placing the spacers are limited to a lower level due to higher resolution of the display panel, and the spacer PS is placed in the vicinity of the TFT. In other words, as illustrated in FIG. 2, the spacer PS is formed on the CF substrate 200 so as to be placed between the TFTs that are adjacent to each other in the row direction in the plan view. Further, one or a plurality of spacers PS may be provided to one pixel group including pixels of respective colors (red, blue, and green in this embodiment), or the spacers PS may be provided at the rate of one spacer PS for a plurality of pixel groups. Further, a shape of the spacer PS is not limited to a columnar shape, and may be a prismatic shape, a conical shape, or the like.

Further, as illustrated in FIG. 2 and FIG. 4, a plurality of seatings 130 for supporting each of the spacers PS when bonded to the CF substrate 200 are formed on the TFT substrate 100. The seatings 130 are formed in vicinities of the TFTs on the TFT substrate 100 in the row direction and the column direction at even intervals. The seating 130 is formed of, for example, a layer stack of an insulating film and a wiring layer.

The liquid crystal display device according to this embodiment defines the placement positions of the spacers PS, to thereby be able to suppress an influence of a leak of light ascribable to the deviation caused when the TFT substrate 100 and the CF substrate 200 are bonded together or warping of the substrates. A specific example of the placement positions of the spacers PS is described below.

Example 1

Figure 5:
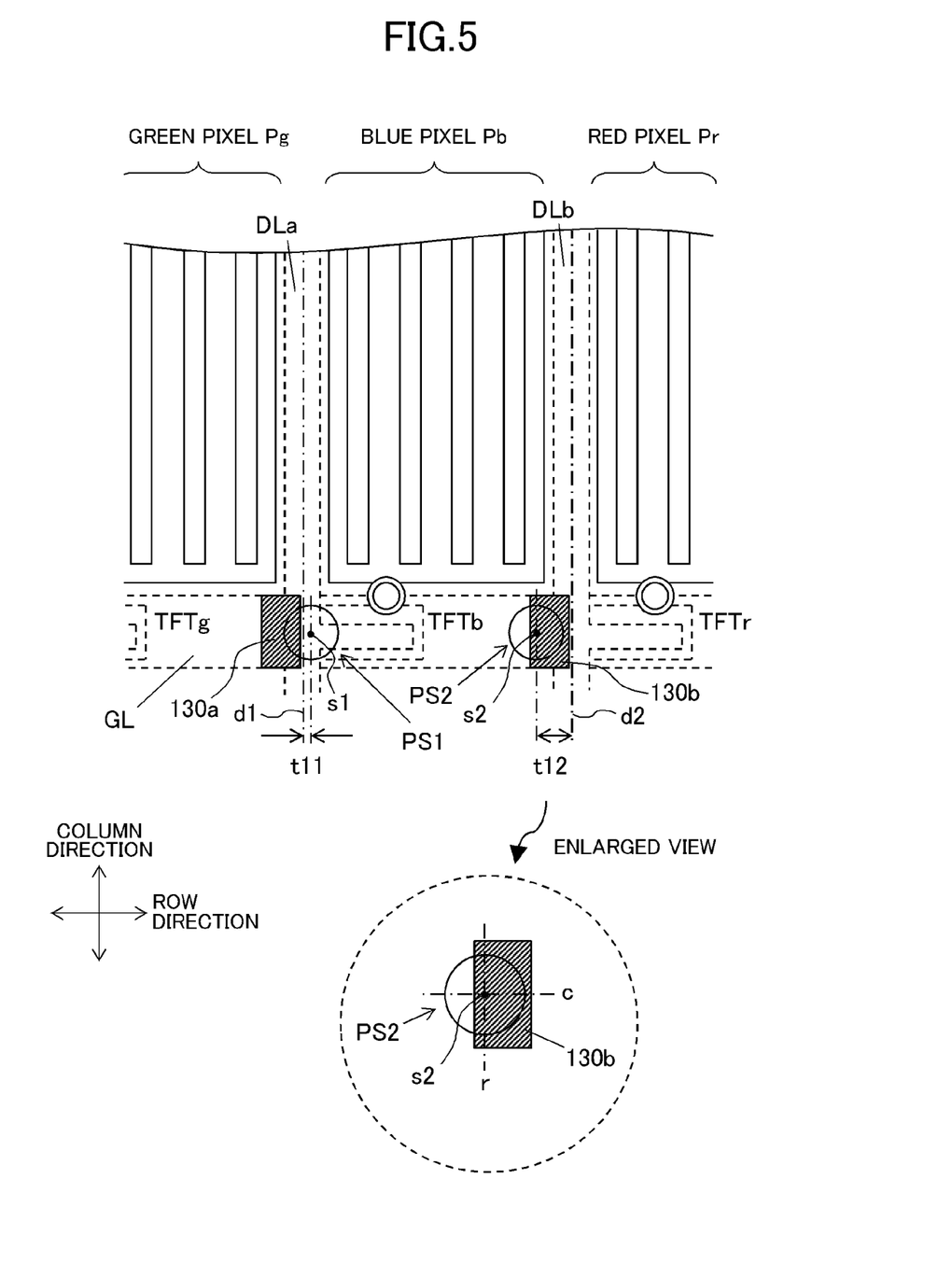
FIG. 5 is an enlarged plan view of a part of a TFT substrate according to Example 1 of the embodiment.

FIG. 5 is an enlarged view of a part of the TFT substrate 100 according to Example 1 of the embodiment. In FIG. 5, the blue pixel Pb is enlarged together with the green pixel Pg and the red pixel Pr that are adjacent thereto.

The plurality of spacers PS include: a first spacer PS1 placed between the first TFT TFTb and the second TFT TFTg that are adjacent to each other in the row direction; and a second spacer PS2 placed between the first TFT TFTb and the third TFT TFTr that are adjacent to each other in the row direction. Further, the plurality of seatings 130 include: a first seating 130a on which the first spacer PS1 is placed; and a second seating 130b on which the second spacer PS2 is placed. The first spacer PS1 and the second spacer PS2 are arranged so that a row-wise distance t11 between a center s1 of the first spacer PS1 and a center d1 of a line width of the first data line DLa is smaller than a row-wise distance t12 between a center s2 of the second spacer PS2 and a center d2 of a line width of the second data line DLb (t11<t12). Note that, for the sake of convenience, FIG. 5 (the same applies to the subsequent figures) illustrates the state of being viewed through the first spacer PS1 and the second spacer PS2. Here, as illustrated in a further enlarged view at the bottom of FIG. 5, the above-mentioned centers (s1 and s2) each represent an intersection point between a row-wise center line c and a column-wise center line r on a surface of the spacer PS opposed to the TFT substrate 100 (opposed area). In other words, the above-mentioned centers (s1 and s2) each represent an intersection point between the center line c extending in the row direction and the center line r extending in the column direction in a projected area obtained by projecting the above-mentioned opposed area onto the TFT substrate 100. As illustrated in FIG. 5, in a case where the spacer PS has a columnar shape, the above-mentioned opposed area (projected area) is a circle, and hence the above-mentioned center corresponds to the center of the circle. Further, also in a case where the spacer PS has a conical shape (shape whose cross-section has a smaller area on a TFT substrate 100 side than on a CF substrate 200 side), the above-mentioned opposed area (projected area) is a circle, and hence the above-mentioned center corresponds to the center of the circle. Note that, in a case where a cross-sectional shape or the above-mentioned opposed area (projected area) is not a circle (in a case of being an elliptical or polygonal shape), the above-mentioned center is a center-of-gravity of the above-mentioned opposed area. The same definition of the above-mentioned center applies to the following description.

Example 2

Figure 6:
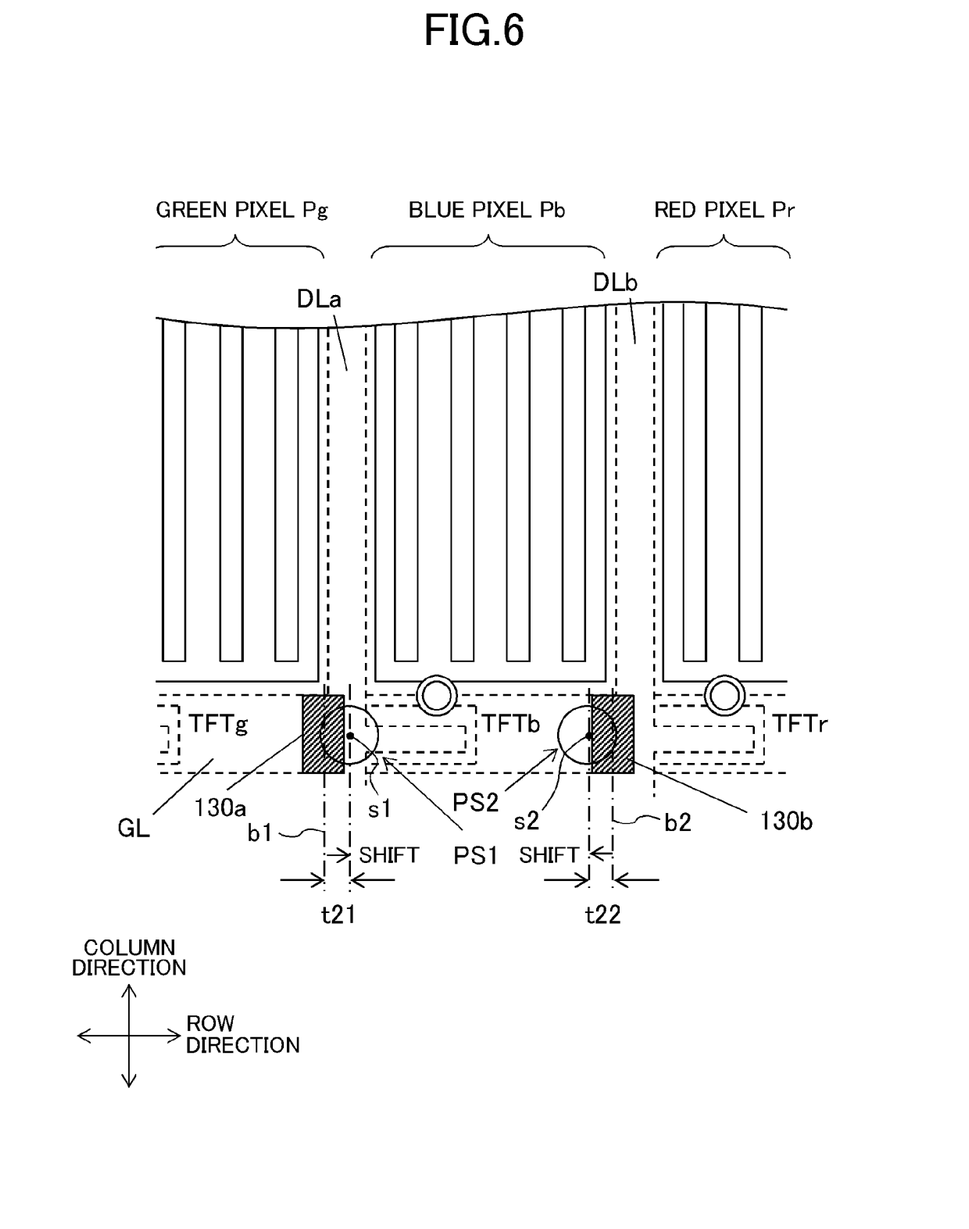
FIG. 6 is an enlarged plan view of a part of a TFT substrate according to Example 2 of the embodiment.

FIG. 6 is an enlarged view of a part of the TFT substrate 100 according to Example 2 of the embodiment. Also in FIG. 6, the blue pixel Pb is enlarged together with the green pixel Pg and the red pixel Pr that are adjacent thereto.

The plurality of seatings 130 include: a first seating 130a formed between the first TFT TFTb and the second TFT TFTg that are adjacent to each other in the row direction; and a second seating 130b formed between the first TFT TFTb and the third TFT TFTr that are adjacent to each other in the row direction. Further, the plurality of spacers PS include: a first spacer PS1 placed on the first seating 130a; and a second spacer PS2 placed on the second seating 130b.

The center s1 of the first spacer PS1 is shifted toward a first TFT TFTb side from a center b1 (center line of row-wise width) of the first seating 130a. The center s2 of the second spacer PS2 is shifted toward the first TFT TFTb side from the center b2 (center line of row-wise width) of the second seating 130b.

Further, the first spacer PS1 and the second spacer PS2 are arranged so that a row-wise distance t21 between the center s1 of the first spacer PS1 and the center b1 of the first seating 130a is substantially the same as a row-wise distance t22 between the center s2 of the second spacer PS2 and the center b2 of the second seating 130b (t21≈t22). For example, the first spacer PS1 is shifted from the center b1 of the first seating 130a toward the first TFT TFTb side (positive direction) by 4 μm, and the second spacer PS2 is shifted from the center b2 of the second seating 130b toward the first TFT TFTb side (negative direction) by 4 μm.

Example 3

Figure 7:
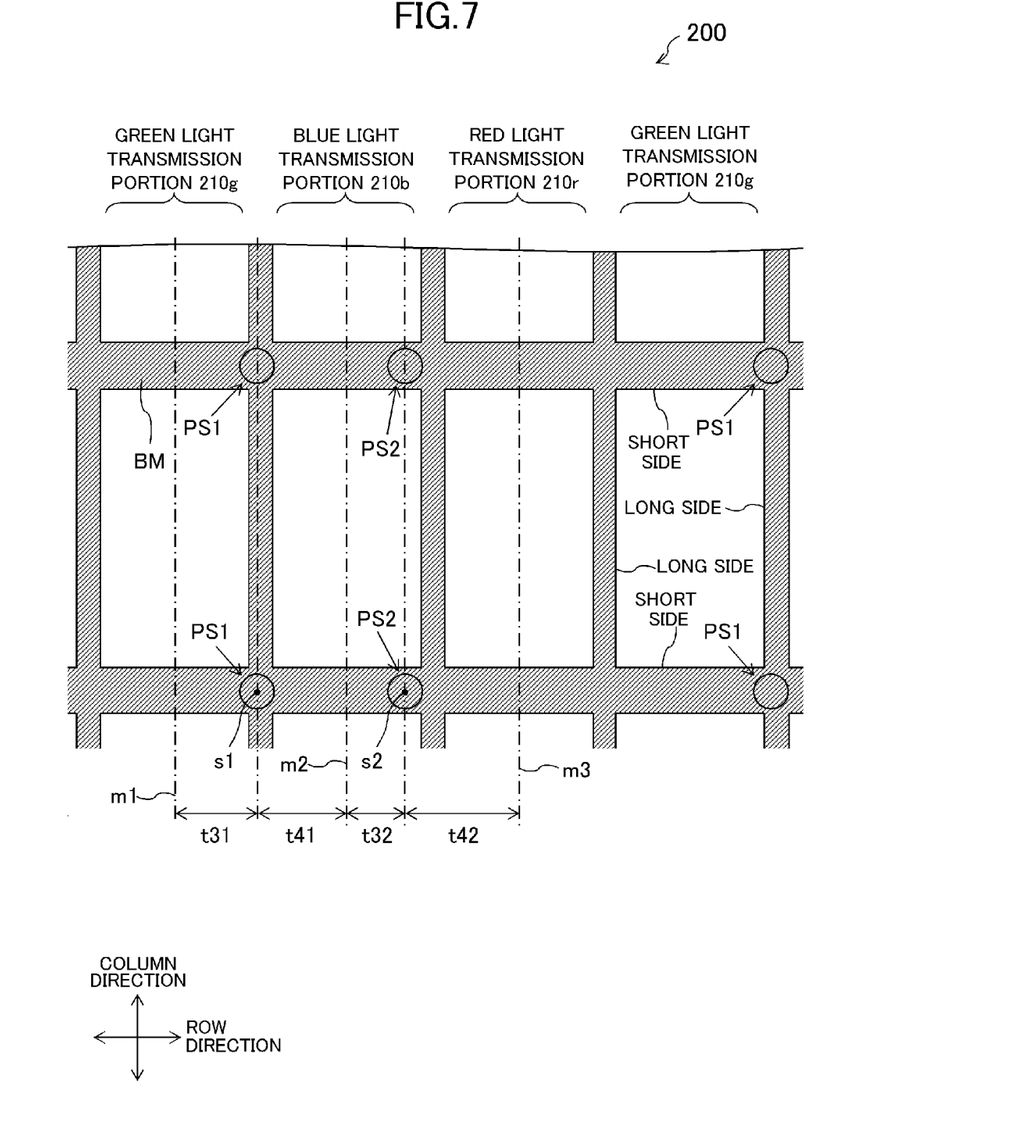
FIG. 7 is an enlarged plan view of a part of a CF substrate according to Example 3 of the embodiment.

FIG. 7 is a view illustrating an enlarged part of the CF substrate 200 according to Example 3 of the embodiment. FIG. 7 illustrates a part opposed to the TFT substrate 100 illustrated in FIG. 2.

The plurality of spacers PS include: the first spacer PS1 placed near a boundary between the blue light transmission portion 210b and the green light transmission portion 210g and near a short side of the light transmission portion 210; and the second spacer PS2 placed near a boundary between the blue light transmission portion 210b and the red light transmission portion 210r and near a short side of the light transmission portion 210.

Further, the first spacer PS1 and the second spacer PS2 are arranged so that a row-wise distance t32 between a center m2 of a short side of the blue light transmission portion 210b and the center s2 of the second spacer PS2 is smaller than a row-wise distance t31 between a center m1 of a short side of the green light transmission portion 210g and the center s1 of the first spacer PS1 (t32<t31).

Further, the first spacer PS1 and the second spacer PS2 are arranged so that a row-wise distance t41 between the center m2 of the short side of the blue light transmission portion 210b and the center s1 of the first spacer PS1 is smaller than a row-wise distance t42 between a center m3 of a short side of the red light transmission portion 210r and the center s2 of the second spacer PS2 (t41<t42).

According to the configuration of each of Examples described above, even if the deviation is caused when the TFT substrate 100 and the CF substrate 200 are bonded together or even if the warping of the substrates occurs, the spacer PS is displaced toward the blue pixel Pb opposed to the blue light transmission portion 210b for transmitting light in a color (blue) that is lowest in visibility among colors of light transmitted by the light transmission portion 210, which can suppress the influence of the leak of light.

Here, in each of Examples described above, as illustrated in FIG. 1 and FIG. 2, the spacer PS is not placed between the third TFT TFTr and the second TFT TFTg that are adjacent to each other in the row direction. In other words, the spacer PS is not placed between the red light transmission portion 210r (red pixel Pr) and the green light transmission portion 210g (green pixel Pg) which transmit light in colors that are higher in visibility than the color of light transmitted by the blue light transmission portion 210b. Therefore, it is possible to suppress the influence of the leak of light ascribable to the deviation caused when the TFT substrate 100 and the CF substrate 200 are bonded together or the warping of the substrates.

In FIG. 5 to FIG. 7 illustrating the configurations according to the respective Examples described above, only a part of the display panel 10 is illustrated, but it should be understood that those configurations are each applied to the entire area of the display panel 10 illustrated in FIG. 1.

Here, the spacer PS can be formed on the CF substrate 200 by a known method. For example, the photosensitive resin composition can be used to form the spacer PS (photospacer) by photolithography. Further, the spacer PS may be formed of a layer stack obtained by stacking respective coloring layers.

Further, in each of Examples described above, the spacer PS is placed around the green light transmission portion 210g for transmitting light in a color (green) that is highest in visibility among the colors of light transmitted by the light transmission portion 210. In this case, there is a fear that, during a rubbing process, light may leak through a flaw caused in the light transmission portion 210 due to an influence of the spacer PS placed around the green light transmission portion 210g. In other words, there is a concern about the influence of the leak of light caused by the spacer PS placed around the green light transmission portion 210g. Therefore, an alignment layer formed on the TFT substrate 100 and the CF substrate 200 may be subjected to a light alignment process. The rubbing process becomes unnecessary by using a light alignment layer, and hence it is possible to prevent the influence of the leak of light accompanied by a defect in rubbing ascribable to placement of the spacer PS particularly on the CF substrate 200.

Further, in each of Examples described above, the light transmission portion 210 includes the red light transmission portion 210r, the green light transmission portion 210g, and the blue light transmission portion 210b. However, the present invention is not limited thereto, and the light transmission portion 210 may further include the light transmission portion 210 for transmitting light in a color other than red, green, or blue.

According to the configuration of the liquid crystal display device of the above-mentioned embodiment, even if the deviation is caused when two substrates are bonded together or even if the warping of the substrates occurs, the spacer is displaced toward the pixel opposed to the light transmission portion for transmitting light in a color that is low in visibility, which can suppress the influence of the leak of light.

While there have been described what are at present considered to be certain embodiments of the application, it will be understood that various modifications may be made thereto, and it is intended that the appended claims cover all such modifications as fall within the true spirit and scope of the invention.

What is claimed is:

1. A display device, comprising:
a first substrate;
a second substrate opposed to the first substrate;
a plurality of spacers placed between the first substrate and the second substrate, the plurality of spacers being formed on the second substrate;
a plurality of data lines extending in a column direction, which are formed on the first substrate;
a plurality of gate lines extending in a row direction, which are formed on the first substrate;
a plurality of thin film transistors each formed on the first substrate near an intersection of each of the plurality of data lines and each of the plurality of gate lines;
a plurality of pixels formed on the first substrate and arranged in a matrix shape, the plurality of pixels each being defined by adjacent two of the plurality of data lines and adjacent two of the plurality of gate lines; and
a plurality of light transmission portions formed on the second substrate, so as to be opposed to the plurality of pixels on a one-to-one basis,
the plurality of pixels comprising:
a first pixel opposed to a first light transmission portion for transmitting light in a first color;
a second pixel opposed to a second light transmission portion for transmitting light in a second color that is higher in visibility than the light in the first color; and
a third pixel opposed to a third light transmission portion for transmitting light in a third color that is higher in visibility than the light in the first color,
the plurality of data lines comprising:
a first data line placed between the first pixel and the second pixel that are adjacent to each other; and
a second data line placed between the first pixel and the third pixel that are adjacent to each other,
the plurality of thin film transistors comprising:
a first thin film transistor formed within an area of the first pixel;
a second thin film transistor formed within an area of the second pixel; and
a third thin film transistor formed within an area of the third pixel, the plurality of spacers comprising:
a first spacer placed between the first thin film transistor and the second thin film transistor that are adjacent to each other in the row direction; and
a second spacer placed between the first thin film transistor and the third thin film transistor that are adjacent to each other in the row direction,
wherein a distance between a center of the first spacer and a center of a line width of the first data line is smaller than a distance between a center of the second spacer and a center of a line width of the second data line.

2. The display device according to claim 1, further comprising a liquid crystal layer between the first substrate and the second substrate, wherein:
the first substrate further comprises an alignment layer; and
the alignment layer is subjected to a light alignment process.

3. The display device according to claim 1, further comprising a plurality of seatings for supporting the plurality of spacers, the plurality of seatings being formed in the first substrate, wherein
the plurality of seatings include a first seating and a second seating, the first spacer being supported by the first seating and the second spacer being supported by the second seating.

4. A display device, comprising:
a first substrate;
a second substrate opposed to the first substrate;
a plurality of spacers placed between the first substrate and the second substrate;
a plurality of seatings for supporting the plurality of spacers, which are formed on the first substrate;
a plurality of data lines extending in a column direction, which are formed on the first substrate;
a plurality of gate lines extending in a row direction, which are formed on the first substrate;
a plurality of thin film transistors each formed on the first substrate near an intersection of each of the plurality of data lines and each of the plurality of gate lines;
a plurality of pixels formed on the first substrate and arranged in a matrix shape, the plurality of pixels each being defined by adjacent two of the plurality of data lines and adjacent two of the plurality of gate lines; and
a plurality of light transmission portions formed on the second substrate, so as to be opposed to the plurality of pixels on a one-to-one basis,
the plurality of pixels comprising:
a first pixel opposed to a first light transmission portion for transmitting light in a first color;
a second pixel opposed to a second light transmission portion for transmitting light in a second color that is higher in visibility than the light in the first color; and
a third pixel opposed to a third light transmission portion for transmitting light in a third color that is higher in visibility than the light in the first color,
the plurality of data lines comprising:
a first data line placed between the first pixel and the second pixel that are adjacent to each other; and
a second data line placed between the first pixel and the third pixel that are adjacent to each other,
the plurality of thin film transistors comprising:
a first thin film transistor formed within an area of the first pixel;
a second thin film transistor formed within an area of the second pixel; and
a third thin film transistor formed within an area of the third pixel,
the plurality of seatings comprising:
a first seating placed between the first thin film transistor and the second thin film transistor that are adjacent to each other in the row direction; and
a second seating placed between the first thin film transistor and the third thin film transistor that are adjacent to each other in the row direction,
the plurality of spacers comprising:
a first spacer placed on the first seating; and a second spacer placed on the second seating,
wherein a center of the first spacer is shifted toward the first thin film transistor side from a center of the first seating, and a center of the second spacer is shifted toward the first thin film transistor side from a center of the second seating.

5. The display device according to claim 4, wherein a distance between the center of the first spacer and the center of the first seating is substantially the same as a distance between the center of the second spacer and the center of the second seating.

6. A display device, comprising:
a first substrate;
a second substrate opposed to the first substrate;
a plurality of spacers placed between the first substrate and the second substrate;
a plurality of data lines extending in a column direction, which are formed on the first substrate;
a plurality of gate lines extending in a row direction, which are formed on the first substrate;
a plurality of thin film transistors each formed on the first substrate near an intersection of each of the plurality of data lines and each of the plurality of gate lines;
a plurality of pixels formed on the first substrate and arranged in a matrix shape, the plurality of pixels each being defined by adjacent two of the plurality of data lines and adjacent two of the plurality of gate lines; and
a plurality of light transmission portions formed on the second substrate, so as to be opposed to the plurality of pixels on a one-to-one basis,
the plurality of pixels comprising:
a blue pixel opposed to a light transmission portion for transmitting blue light;
a green pixel opposed to a light transmission portion for transmitting green light; and
a red pixel opposed to a light transmission portion for transmitting red light,
the plurality of thin film transistors comprising:
a first thin film transistor formed within an area of the blue pixel;
a second thin film transistor formed within an area of the green pixel; and
a third thin film transistor formed within an area of the red pixel,
the plurality of pixels defining a plurality of pixel sets that are arranged in a matrix, each of the plurality of pixel sets comprising one red pixel, one green pixel and one blue pixel arranged in this order in a row direction,
wherein, for each of the plurality of pixel sets, no spacer is present between the third thin film transistor in one of said pixel sets and the second thin film transistor in said one pixel set, a first spacer is present between the second thin film transistor in said one pixel set and the first thin film transistor in said one pixel set, and a second spacer is present between the first thin film transistor in said one pixel set and the third thin film transistor in a pixel set adjacent in the row direction to said one pixel set.

7. A display device, comprising:
a first substrate;
a second substrate opposed to the first substrate; and
a plurality of spacers placed between the first substrate and the second substrate, the plurality of spacers being formed on the second substrate,
the second substrate comprising:
a blue light transmission portion formed thereon, for transmitting blue light;
a green light transmission portion formed thereon, for transmitting green light; and
a red light transmission portion formed thereon, for transmitting red light,
which are placed in a matrix shape and each of which is surrounded by a light shielding layer and has an area for transmitting light, the area having substantially a rectangle shape formed of short sides and long sides,
the plurality of spacers comprising:
a first spacer placed near a boundary between the blue light transmission portion and the green light transmission portion and near a short side of the light transmission portion; and
a second spacer placed near a boundary between the blue light transmission portion and the red light transmission portion and near the short side of the light transmission portion,
wherein a distance between a center of a short side of the blue light transmission portion and a center of the second spacer is smaller than a distance between a center of a short side of the green light transmission portion and a center of the first spacer.

8. A display device, comprising:
a first substrate;
a second substrate opposed to the first substrate; and
a plurality of spacers placed between the first substrate and the second substrate, the plurality of spacers being formed on the second substrate,
the second substrate comprising:
a blue light transmission portion formed thereon, for transmitting blue light;
a green light transmission portion formed thereon, for transmitting green light; and
a red light transmission portion formed thereon, for transmitting red light,
which are placed in a matrix shape and each of which is surrounded by a light shielding layer and has an area for transmitting light, the area having substantially a rectangle shape formed of short sides and long sides,
the plurality of spacers comprising:
a first spacer placed near a boundary between the blue light transmission portion and the green light transmission portion and near a short side of the light transmission portion; and
a second spacer placed near a boundary between the blue light transmission portion and the red light transmission portion and near the short side of the light transmission portion,
wherein a distance between a center of a short side of the blue light transmission portion and a center of the first spacer is smaller than a distance between a center of a short side of the red light transmission portion and a center of the second spacer.

* * * * *